(12) United States Patent
Hong

(10) Patent No.: US 9,781,785 B2
(45) Date of Patent: Oct. 3, 2017

(54) BALLAST TYPE DETECTING CIRCUIT AND LIGHT EMITTING DIODE LIGHTING APPARATUS HAVING THE SAME

(71) Applicant: Magnachip Semiconductor, Ltd., Cheongju-si (KR)

(72) Inventor: Seung Woo Hong, Seoul (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/941,074

(22) Filed: Nov. 13, 2015

(65) Prior Publication Data

US 2016/0165687 A1 Jun. 9, 2016

(30) Foreign Application Priority Data

Dec. 8, 2014 (KR) .................. 10-2014-0175168

(51) Int. Cl.
*H05B 33/08* (2006.01)
*G01R 23/00* (2006.01)
*G01R 17/00* (2006.01)

(52) U.S. Cl.
CPC ......... *H05B 33/0815* (2013.01); *G01R 17/00* (2013.01); *G01R 23/005* (2013.01); *H05B 33/0842* (2013.01)

(58) Field of Classification Search
CPC . F21K 9/27; F21K 9/272; F21K 9/275; F21K 9/278; F21V 23/06; F21V 29/83; F21V 3/0418; F21V 7/22; G01K 7/01; G01R 17/00; G01R 23/005; G01R 31/245; H02H 3/24; H05B 33/0803; H05B 33/0806; H05B 33/0809; H05B 33/0815; H05B 33/0824; H05B 33/0827; H05B 33/083; H05B 33/0842; H05B 33/0845; H05B 33/0848; H05B 33/0851; H05B 33/0854; H05B 33/0884; H05B 33/0887; H05B 33/089; H05B 33/0893; H05B 35/00; H05B 37/02; H05B 37/0272; H05B 41/046; H05B 41/2827; H05B 41/2851; H05B 41/2855; H05B 41/295; H05B 41/36
See application file for complete search history.

(56) References Cited

U.S. PATENT DOCUMENTS 5,296,815 A * 3/1994 Conway ............... G01R 31/245
324/133
6,445,142 B1 * 9/2002 Xia ........................ H05B 41/36
315/307

(Continued)

*Primary Examiner* — Alexander H Taningco
*Assistant Examiner* — Seokjin Kim
(74) *Attorney, Agent, or Firm* — NSIP Law

(57) ABSTRACT

A ballast type detecting circuit includes a ballast signal clamping circuit coupled to a ballast, wherein the ballast signal clamping unit is configured to clamp an output of the ballast, and a ballast type detection circuit configured to compare first and second reference clocks and the clamped output of the ballast to determine a type of the ballast, each of the first and second reference clocks having a frequency lower than an output frequency of a first type ballast and higher than an output frequency of a second type ballast. Thus, the ballast type detecting circuit detects a type of electronic ballast and magnetic ballast based on a digital output signal and decreases a number of outside circuit elements through a ballast type detection based on a digital output signal.

20 Claims, 4 Drawing Sheets

(56) References Cited

U.S. PATENT DOCUMENTS

| | | | | |
|---|---|---|---|---|
| 2009/0200955 A1* | 8/2009 | Maros | ................... | H05B 35/00 |
| | | | | 315/246 |
| 2011/0309763 A1* | 12/2011 | Tran | ................... | H05B 37/0272 |
| | | | | 315/246 |
| 2012/0188670 A1* | 7/2012 | Lee | ................... | H02H 3/24 |
| | | | | 361/56 |
| 2012/0248984 A1* | 10/2012 | Hu | ................... | H05B 41/295 |
| | | | | 315/116 |
| 2012/0319588 A1* | 12/2012 | Sid | ................... | H05B 41/2855 |
| | | | | 315/129 |
| 2013/0221867 A1* | 8/2013 | Deppe | ................... | H05B 33/0809 |
| | | | | 315/224 |
| 2013/0342119 A1* | 12/2013 | Malboeuf Joset | . | H05B 33/0809 |
| | | | | 315/193 |
| 2014/0265900 A1* | 9/2014 | Sadwick | ................... | H05B 33/0803 |
| | | | | 315/200 R |
| 2015/0198290 A1* | 7/2015 | Segers | ................... | H05B 33/0827 |
| | | | | 315/191 |
| 2016/0066386 A1* | 3/2016 | Catalano | ................... | H05B 33/0854 |
| | | | | 315/309 |
| 2017/0105263 A1* | 4/2017 | Xiong | ................... | H05B 33/0887 |

\* cited by examiner

BALLAST TYPE DETECTING CIRCUIT AND LIGHT EMITTING DIODE LIGHTING APPARATUS HAVING THE SAME

CROSS-REFERENCE TO RELATED APPLICATION(S)

This application claims the benefit under 35 USC 119(a) of Korean Patent Application No. 10-2014-0175168 filed on Dec. 8, 2014 in the Korean Intellectual Property Office, the entire disclosure of which is incorporated herein by reference for all purposes.

BACKGROUND

1. Field

The following description relates to a ballast type detecting technology. The following description also relates to a ballast type detecting circuit and a Light Emitting Diode (LED) lighting apparatus having the same for determining a type of a ballast to control a light apparatus, according to the type of the ballast.

2. Description of Related Art

Recently, a Light Emitting Diode (LED) is under consideration as a new lighting technology instead of a filament lamp or a fluorescent light. The LED may be driven in a low voltage, may have a longer lifetime, a lower power consumption, a faster response time and/or a stronger resistance when compared with other lighting apparatus types and may be implemented as a smaller size and a lighter weight apparatus. However, because the LED is operated using a low DC power and unlike a fluorescent light, the conventional LED may not be applied to a fluorescent light system. For example, when an LED drive circuit is directly coupled to a terminal of a conventional ballast, the LED drive circuit may not properly handle a high frequency or voltage of the ballast. As a result, such an LED may not be operate properly or may even explode.

Also, an output of an electronic ballast provides a pulse wave form having a high frequency and high voltage and an output of a magnetic ballast provides an AC input waveform having a low frequency. Because the electronic and magnetic ballasts may have different input characteristics and different control characteristics, it is desirable to have a circuit generating a selective signal according to a ballast type. A conventional ballast selection circuit is designed using an analog approach and needs many more outside elements, such as including an analog filter for frequency selection and a noise filter for noise elimination.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples disclosed in the present disclosure propose a ballast type detecting circuit and a Light Emitting Diode (LED) lighting apparatus that detect a type of a ballast such as an electronic or a magnetic ballast based on a digital output signal.

Examples disclosed in the present disclosure also propose a ballast type detecting circuit and a Light Emitting Diode (LED) lighting apparatus for decreasing a number of outside circuits and elements through a ballast type detection based on a digital output signal.

In one general aspect, a ballast type detecting circuit includes a ballast signal clamping circuit coupled to a ballast, wherein the ballast signal clamping circuit is configured to clamp an output of the ballast, and a ballast type detection circuit configured to compare first and second reference clocks and the clamped output of the ballast to determine a type of the ballast, each of the first and second reference clocks having a frequency lower than an output frequency of a first type ballast and higher than an output frequency of a second type ballast.

The ballast signal clamping circuit may include a high voltage protection circuit configured to protect the ballast signal clamping circuit from an output of the ballast, a clamping circuit configured to clamp an output of the ballast at a voltage protection level of a low voltage element, and a comparison circuit configured to compare the clamped signal and a reference voltage.

The clamping circuit may apply a DC voltage to an output of the ballast to fix a constant level for a part of a repetition waveform.

The comparison circuit may detect a time at which the clamped signal zero-crosses.

The high voltage protection circuit may be a junction field effect transistor (JFET).

The ballast type detecting circuit may further include a reference clock generator configured to generate the first and second reference clocks.

The ballast type detection circuit may include a high frequency detection circuit configured to determine whether a frequency of the ballast signal is higher than that of the first reference clock, a low frequency detection circuit configured to determine whether a frequency of the ballast signal is lower than that of the second reference clock, and a detection signal output circuit configured to output a ballast type detection signal based on outputs of the high frequency detection circuit and the low frequency detection circuit.

The high frequency detection circuit may count a number of clock pulses of the ballast signal during periods of the first reference clock.

The high frequency detection circuit may output a pulse signal in response to a frequency of the ballast signal being higher than a frequency of the first reference clock.

The low frequency detection circuit may count a number of clock pulses of the second reference clock during periods of the ballast signal.

The low frequency detection circuit may output a pulse signal in response to a frequency of the second reference clock being higher than a frequency of the ballast signal.

The detection signal output circuit may be a latch element.

In another general aspect, a light emitting diode light apparatus includes a ballast, a ballast type detecting circuit configured to detect an output signal of the ballast to determine the type of the ballast, a lighting circuit including a light apparatus, the lighting circuit being configured to drive the light apparatus, and a controller configured to receive the ballast type detecting signal from the ballast type detecting circuit to control the lighting circuit, wherein the ballast type detecting circuit includes a ballast signal clamping circuit coupled to a ballast, wherein the ballast signal clamping circuit is configured to clamp an output of the ballast, and a ballast type detection circuit configured to compare first and second reference clocks and the clamped output of the ballast to determine a type of the ballast, each of the first and second reference clocks having a frequency lower than an output frequency of a first type ballast and higher than an output frequency of a second type ballast.

The lighting unit may be a flyback converter.

The control unit may control the lighting unit according to a type of the ballast.

In another general aspect, a ballast type detection circuit includes a high frequency detection circuit configured to determine whether a frequency of a ballast signal is higher than that of a first reference clock, a low frequency detection circuit configured to determine whether a frequency of the ballast signal is lower than that of a second reference clock, and a detection signal output circuit configured to output a ballast type detecting signal based on outputs of the high frequency detection circuit and the low frequency detection circuit, each of the first and second reference clocks having a frequency lower than an output frequency of a first type ballast and higher than an output frequency of a second type ballast.

The high frequency detection circuit may count a number of clock pulses of the ballast signal during periods of the first reference clock.

The high frequency detection circuit may output a pulse signal in response to a frequency of the ballast signal being higher than a frequency of the first reference clock.

The low frequency detection circuit may count a number of clock pulses of the second reference clock during periods of the ballast signal.

The low frequency detection circuit may output a pulse signal in response to a frequency of the second reference clock being higher than a frequency of the ballast signal.

Other features and aspects will be apparent from the following detailed description, the drawings, and the claims.

Figure 1:
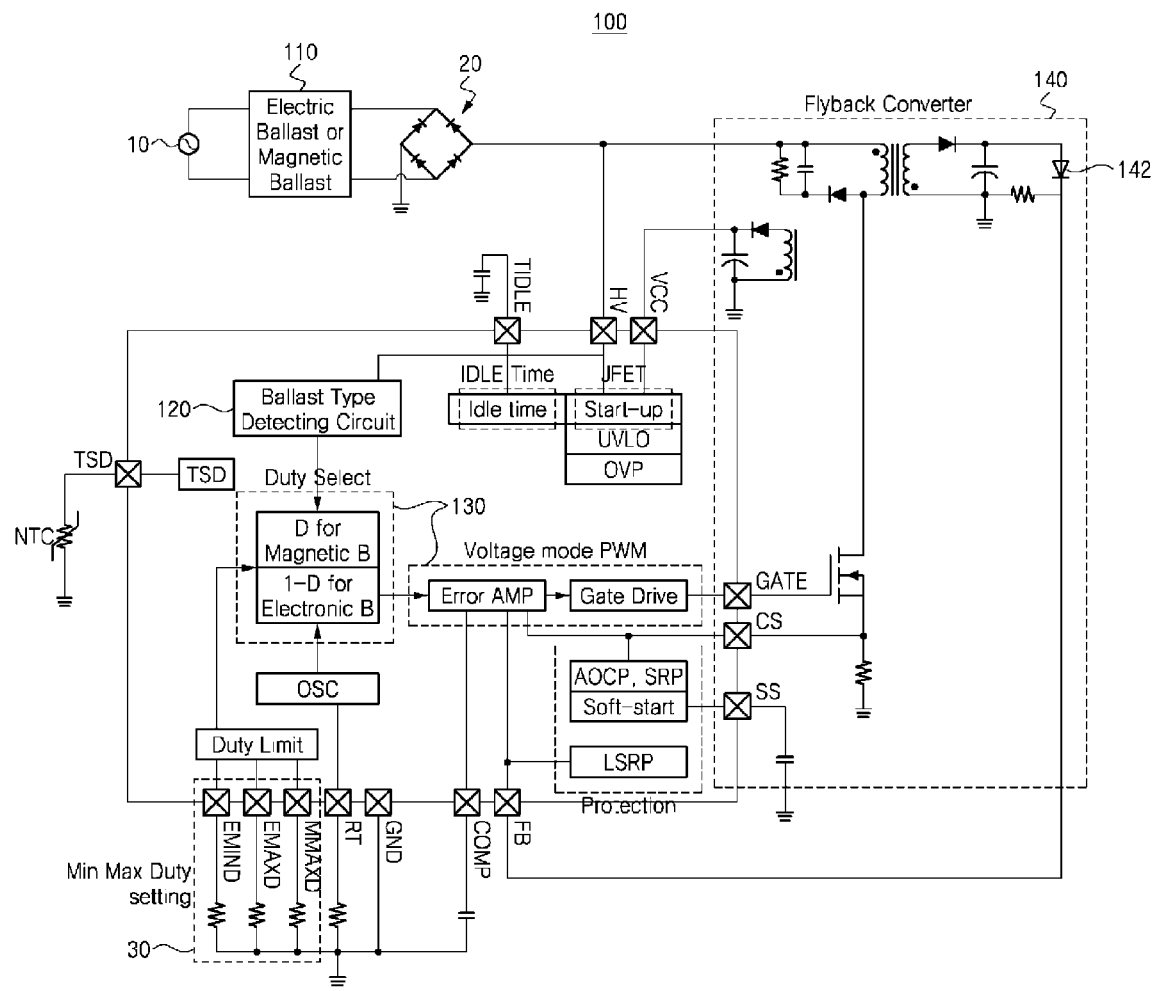
FIG. 1 is a circuit diagram illustrating a light-emitting diode light apparatus according to an example.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It is to be noted that the features illustrated in the drawings are not necessarily drawn to scale, and features of one example are optionally employed with other examples as the skilled artisan would recognize, even if not explicitly stated herein. Descriptions of well-known components and processing techniques are omitted so as to not unnecessarily obscure the examples. The examples used herein are intended merely to facilitate an understanding of ways in which the disclosure may be practiced and to further enable those of skill in the art to practice the various examples. Accordingly, the examples presented herein are not to be construed as limiting the scope of the possible examples. Various changes, modifications, and equivalents of the systems, apparatuses and/or methods described herein are intended to be apparent to one of ordinary skill in the art. Moreover, it is noted that like reference numerals are used to represent similar parts throughout the several views of the drawings.

While terms such as "first," "second," and the like, are used to describe various components, such components are not to be understood as being limited to the terms. The terms are merely used to help the reader distinguish one component from another.

It is to be understood that when an element is referred to as being "connected to" or "connected with" another element, the element is directly connected to the other element or alternatively, intervening elements are also present. By contrast, when an element is referred to as being "directly connected to" another element, no intervening elements are present, except where the context makes it clear that other intervening elements are present. In addition, unless explicitly described to the contrary, the word "comprise" and variations such as "comprises" or "comprising," or synonyms such as "including" or "having," are to be understood to imply the inclusion of stated elements but not the exclusion of any other elements. Meanwhile, other expressions describing relationships between components such as "between", "immediately between" or "adjacent to" and "directly adjacent to" are to be construed similarly.

Singular forms "a", "an" and "the" in the present disclosure are intended to include the plural forms as well, unless the context clearly indicates otherwise.

Devices that are in communication with each other are not required to be in continuous communication with each other, unless expressly specified otherwise. In addition, devices that are in communication with each other optionally communicate directly or indirectly through one or more intermediaries.

Although process steps, method steps, algorithms, or the like, are described in a sequential order, such processes, methods and algorithms are potentially configured to operate in alternate orders. In other words, any sequence or order of steps that is described does not indicate a requirement that the steps be performed in that order. The steps of the processes, methods or algorithms described herein are potentially performed in any order that is practical. Further, some steps are performed simultaneously.

When a single device or article is described herein, it is intended to be readily apparent that more than one device or article are potentially used in place of a single device or article. Similarly, where more than one device or article is described herein, it is intended to be readily apparent that a single device or article is potentially used in place of the more than one device or article. The functionality or the features of a device are potentially alternatively embodied by one or more other devices that are not explicitly described as having such functionality or features.

FIG. 1 is a circuit diagram illustrating a light-emitting diode light apparatus according to an example.

Referring to the example of FIG. 1, a Light Emitting Diode (LED) lighting apparatus 100 includes an AC input power source 10, a bridge diode 20, a duty setting unit 30, a ballast 110, a ballast type detecting circuit 120, a control unit 130 and a lighting unit 140.

The AC input power source 10 corresponds to a source of an AC input voltage signal $V_{IN}$. In an example, an AC input voltage $V_{IN}$ corresponds to, though it is not limited to, about 50 Hz or 60 Hz according to a power supplier, and a frequency of the AC input voltage signal $V_{IN}$ potentially fluctuates according to a current distribution system.

In the example of FIG. 1, the bridge diode 20 is electrically coupled to the AC input power source 10 and is configured by coupling a plurality of diode elements to each other. For example, the bridge diode 20 full-wave rectifies the AC input voltage signal $V_{IN}$. In this example, the full-wave rectified AC input voltage $V_{IN}$ is provided to the lighting unit 140.

For example, the ballast 110 is series coupled to the AC input power source 10 and the bridge diode 20. The lighting unit 140 operates by repeating a charge and discharge of a capacitive element. However, when a drive current is excessively increased, there is a risk of destructing the lighting apparatus. To manage this issue, in some example, the ballast 110 prevents the drive current's exceeding a current limit.

In the example of FIG. 1, the ballast type detecting circuit 120 is electrically coupled to the ballast 110 through an HV pin. In this example, the ballast type detecting circuit 120 detects an output signal of the ballast 110 to determine a type of the ballast 110. In various examples, the ballast 110 has different input voltage characteristics and control characteristics according to a ballast type and the ballast type detecting circuit 120 generate a detection signal according to a ballast type of the ballast 110.

Also in the example of FIG. 1, the control unit 130 receives a ballast type detecting signal from the ballast type detecting circuit 120 in order to control the lighting unit 140. More specifically, the control unit 130 receives a ballast type detecting signal to control the lighting unit 140 according to a type of the ballast 110.

In this example, the lighting unit 140 is electrically coupled to the control unit 130 through a GATE pin. The lighting unit 140 includes at least one light apparatus 142 and drives the light apparatus 142. In one example, the lighting unit 140 is implemented as a flyback converter and the lighting apparatus 142 is implemented such that a plurality of LEDs is series coupled. The lighting unit 140 is driven by receiving an output of the ballast 110. In such an example, an input and an output of the flyback converter are electrically insulated. Thus, the flyback converter is safe and cost-effective due to minimizing component implementation.

For example, the duty setting unit 30 sets a frequency range for operating the control unit 130. In this example, the duty setting unit 30 set a minimum duty and a maximum duty and the control unit 130 is driven through a frequency satisfying a set duty range.

In the example of FIG. 1, the ballast type detecting circuit 120 receives a DC power VCC for driving a circuit through a VCC pin. The DC power VCC is gradually increased according to the charging of a capacitive element coupled to an outside of the VCC pin. Thus, the ballast type detecting circuit 120 generates a drive power VDD when the DC power VCC is more than a constant voltage and also outputs an enable signal EN. When the enable signal EN is applied, the drive power VDD is provided to each of the ballast type detecting circuits 120.

Also, the ballast type detecting circuit 120 receives a driving voltage of the lighting apparatus 142 through an FB pin. The ballast type detecting circuit 120 compares the voltage received through the FB pin and an internal reference voltage to control a voltage in a COMP pin.

Figure 2:
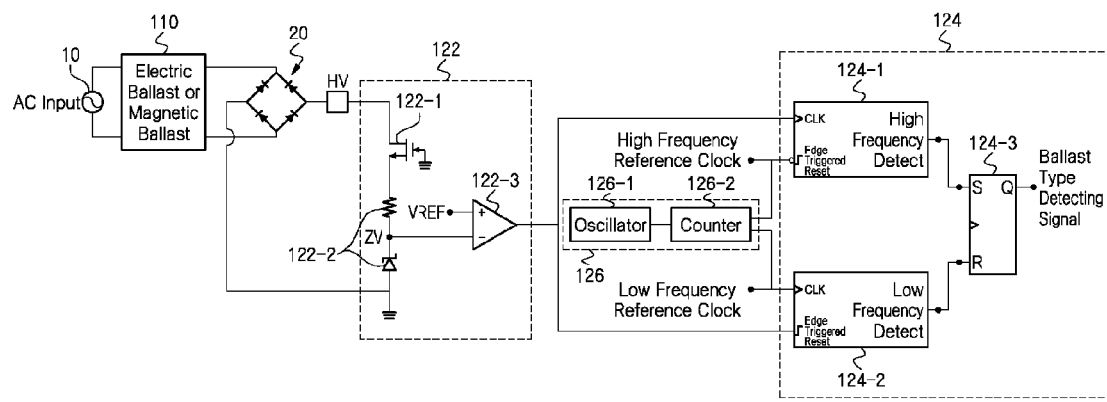
FIG. 2 is a circuit diagram illustrating a ballast type detecting circuit in the example of FIG. 1.

FIG. 2 is a circuit diagram illustrating a ballast type detecting circuit in the example of FIG. 1.

Referring to the example of FIG. 2, the ballast type detecting circuit 120 includes a ballast signal clamping unit 122, a ballast type detection unit 124 and a reference clock generation unit 126.

In the example of FIG. 2, the ballast signal clamping unit 122 includes a high voltage protection module 122-1, a clamping module 122-2 and a comparison module 122-3. The ballast signal clamping unit 122 is electrically coupled to the ballast 110 and clamps an output of the ballast 110.

More specifically, the high voltage protection module 122-1 receives an output of the ballast 110 to protect a circuit from an output of the ballast 110. Because the ballast type detecting circuit 120 is operated using a power that is significantly lower than an input power level from the AC input power source 10, the high voltage protection module 122-1 prevents a circuit overload. In one example, the high voltage protection module 122-1 is implemented as a Junction Field Effect Transistor (JFET). The high voltage protection module 122-1 performs a voltage control resistance function to improve high voltage protection characteristics when the high voltage protection module 122-1 is implemented as the JFET. In this example, the JFET controls a voltage through a voltage inputted to a gate terminal without a bias current.

In this example, the clamping module 122-2 clamps an output of the ballast 110 at a voltage protection level of a low voltage element. The clamping module 122-2 applies a DC voltage to an output of the ballast 110 to fix a part of a waveform into a constant level. For example, the clamping module 122-2 harmonizes a peak value of a repetition wave form with a constant voltage and a minimum value of the wave corresponds to a value of 0V.

The comparison module 122-3 compares the clamped signal and a reference voltage Vref to provide a ballast signal to the ballast type detection unit 122. For example, the comparison module 122-3 detects a time when the clamped signal zero-crosses to output a ballast signal having a pulse wave form. In an example, a frequency of a pulse signal outputted from the comparison module 122-3 is equal to an output frequency of the ballast 110. Thus, the comparison module 122-3 outputs a pulse waveform having an amplitude lower than an output of the ballast 110, but with a same frequency. In one example, the comparison module 122-3 is implemented as an OP-Amp. Here, an OP-Amp is an operational amplifier, which is a DC-couple high-gain electronic voltage amplifier with a differential input.

In an example, the ballast type detection unit 124 includes a high frequency detection module 124-1, a low frequency detection module 124-2 and a detection signal output module 124-3. The ballast type detection unit 124 compares an output of the clamped ballast 110 with first and second reference clocks to determine a type of the ballast 110.

More specifically, in an example, the high frequency detection module 124-1 determines whether a frequency of the ballast signal is higher than that of the first reference clock. Here, the high frequency detection module 124-1 is electrically coupled to the comparison module 122-3 and the reference clock generation unit 126. The high frequency detection module 124-1 receives an output signal of the comparison module 122-3 and a first reference clock. Herein, a frequency of a first reference clock is assumed to be higher than that of a second reference clock. In one example, the high frequency detection module 124-1 counts a number of pulses of a clock signal of the ballast signal for every period of the first reference clock. Namely, the high frequency detection module 124-1 initializes a digital value at an edge of the first reference clock and digitally counts a number of pulses of a clock of the ballast signal. The frequency detection module 124-1 outputs a pulse signal when a frequency of a ballast signal is higher than that of the first reference clock and output a low signal when a frequency of the ballast signal is lower than that of the first reference clock.

The low frequency detection module 124-2 determines whether a frequency of the ballast signal is lower than that of the second reference clock. For example, the low frequency detection module 124-2 is electrically coupled to the comparison module 122-3 and the reference clock generation unit 126. The low frequency detection module 124-2 receives an output signal of the comparison module 122-3 and the second reference clock. In one example, the low frequency detection module 124-2 counts a number of pulses of the second reference clock for every period of the ballast signal. Thus, the low frequency detection module 124-2 initializes a digital value at an edge of the ballast signal and digitally counts a number of pulses of the second reference clock. In this example, the low frequency detection module 124-2 outputs a pulse signal when a frequency of the second reference clock is higher than that of the ballast signal and outputs a low signal when a frequency of the second reference clock is lower than that of the ballast signal.

For example, the detection signal output module 124-3 is electrically coupled to an output terminal of the high frequency detection module 124-1 and the low frequency detection module 124-2. The detection signal output module 124-3 generates a ballast type detecting signal based on outputs of the high frequency detection module 124-1 and the low frequency module 124-2. In one example, the detection signal output module 124-3 is implemented as a latch element. For example, an output of the high frequency detection module 124-1 is coupled to a set terminal and an output of the low frequency detection module 124-2 is coupled to a reset terminal when the detection signal output module 124-3 is implemented as a RS latch element. Thus, the detection signal output module 124-3 outputs a high signal, that is, a value of 1, when the set terminal receives a pulse signal and the reset socket receives a low signal, that is, a value of 0. On the other hand, the detection signal output module 124-3 outputs a low signal, that is, a value of 0, when the set terminal receives a low signal, that is, a value of 0, and the reset socket receives a pulse signal.

In an example, the reference clock generation unit 126 includes an oscillator 126-1 and a clock generation module 126-2. The reference clock generation unit 126 is electrically coupled to the high frequency detection module 124-1 and the low frequency detection module 124-2 to provide the first and second reference clocks to each of the high frequency detection module 124-1 and the low frequency detection module 124-2.

The oscillator 126-1 generates a signal through an oscillation. An energy of the oscillation by the oscillator 126-1 is decreased accordingly as time passes and an amount of increased energy per oscillation is compensated for from outside. In one example, the oscillator 126-1 receives a drive power to maintain as an output a constant amplitude. The oscillator 126-1 provides a generated signal to the clock generation module 126-2.

The clock generation module 126-2 receives an output of the oscillator 126-1 to generate the first and second reference clocks. For example, the clock generation module 126-2 provides the first reference clock to the high frequency detection module 124-1 and provides the second reference clock to the low frequency detection module 124-2 for preventing incorrect operation and for removing noise.

Figure 3A:
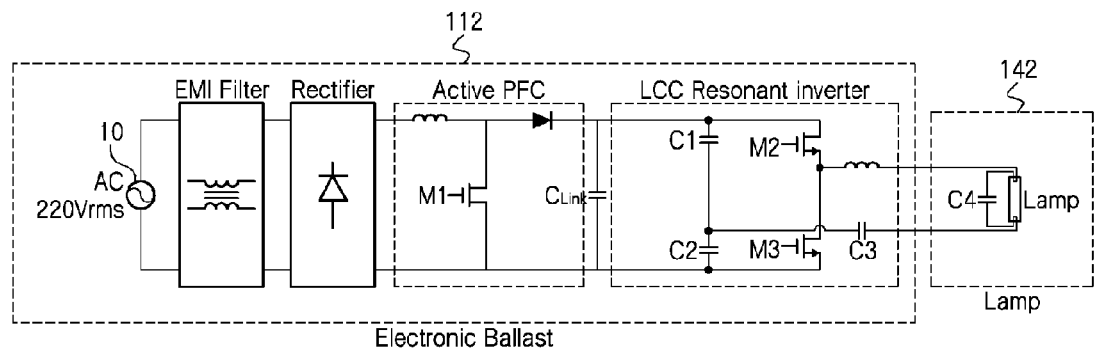
FIGS. 3A-3B are circuit diagrams illustrating types of ballasts in the example of FIG. 1.
Figure 3B:
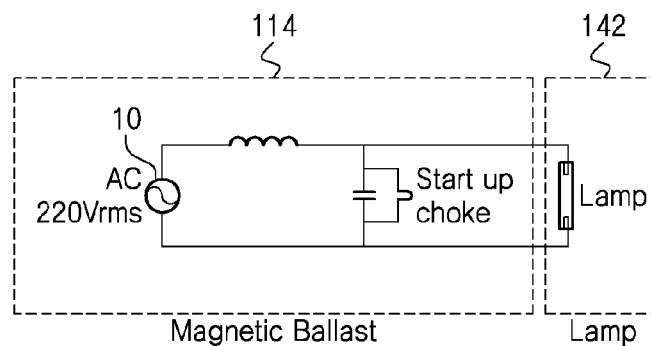

FIGS. 3A-3B are circuit diagrams illustrating types of ballasts in the example of FIG. 1.

FIG. 3A indicates a first type of ballast, and the FIG. 3B indicates a second type of ballast.

In examples, the ballast 110 includes the first type ballast 112 and the second type ballast 114. In one embodiment, the first type ballast 112 is implemented as an electronic ballast and the second type ballast 114 is implemented as a magnetic ballast. In this example, the electronic ballast outputs a pulse waveform having a frequency of about 40 kHz and an amplitude of about 400V. The magnetic ballast outputs a pulse waveform having a frequency of about 120 Hz and an amplitude of about 85-265V. Therefore, the lighting unit 140 is controlled according to characteristics of the ballast 110 because the electronic ballast and the magnetic ballast have different input voltage characteristics and control characteristics. In examples, the first type ballast 112 is assumed to have a voltage amplitude and a frequency that are higher than those of the second type ballast 114. Also, an output frequency of the first type ballast 112 is assumed to be higher than that of the first reference clock and an output frequency of the second type ballast 114 is assumed to be lower than that of the second reference clock.

Figure 4:
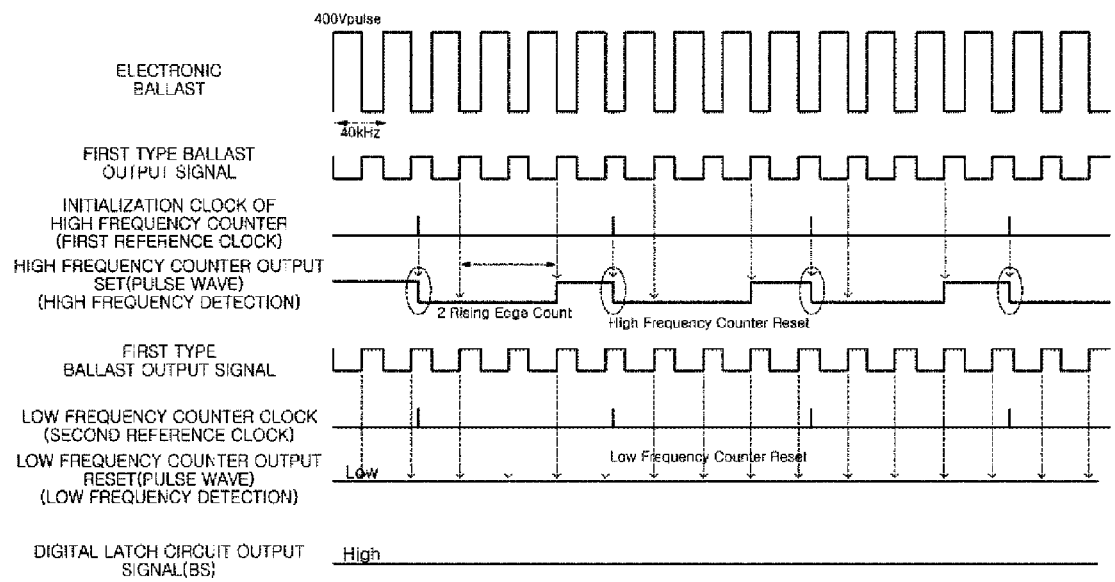
FIG. 4 is a timing diagram illustrating a procedure where a ballast type detecting circuit in FIG. 2 detects a first type ballast.

FIG. 4 is a timing diagram illustrating a procedure where a ballast type detecting circuit in FIG. 2 detects a first type ballast.

In one example, when the ballast type detecting circuit 120 receives a ballast signal from the first type ballast 112, the received ballast signal corresponds to a pulse wave with high voltage and high frequency. The ballast signal clamping unit 122 clamps an output of the first type ballast 112 and compares the clamped output and a reference voltage to provide the comparison result to the ballast type detection unit 124. The high frequency detection module 124-1 counts a number of pulses of a clock of the ballast signal every period of the first reference clock and the low frequency detection module 124-2 counts a number of pulses of the second reference clock every period of the ballast signal. Therefore, when the ballast type detecting circuit 120 receives the ballast signal from the first type ballast 112, the high frequency detection module 124-1 outputs a pulse wave and the low frequency detection module 124-2 outputs a low signal. This result is achieved because a frequency of the ballast signal is higher than that of the first and second reference clocks. Thus, the detection signal output module 124-3 receives a pulse wave in the set terminal and receives a low signal, that is, a value of 0, in the reset terminal to output a high signal, that is, a value of 1.

Figure 5:
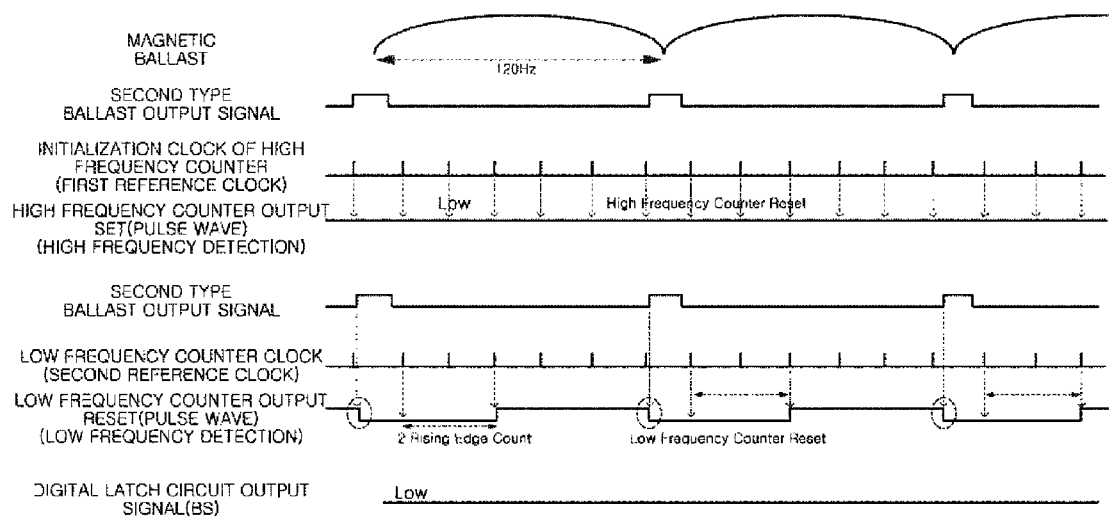
FIG. 5 is a timing diagram illustrating a procedure where a ballast type detecting circuit in FIG. 2 detects a second type ballast.

FIG. 5 is a timing diagram illustrating a procedure where a ballast type detecting circuit in FIG. 2 detects a second type ballast.

In one example, when the ballast type detecting circuit 120 receives the ballast signal from the second type ballast 114, the received ballast signal corresponds to a pulse wave with a low voltage and a low frequency. The ballast signal clamping unit 122 clamps an output of the second type ballast 114 and compares the clamped output and a reference voltage to provide the comparison result to the ballast type detection unit 124. The high frequency detection module 124-1 counts a number of a clock pulses of the ballast signal every period of the first reference clock and the low frequency detection module 124-2 count a number of pulses of the second reference clock every period of the ballast signal. Therefore, when the ballast type detecting circuit 120 receives a ballast signal from the second type ballast 114, the high frequency detection module 124-1 outputs a low signal, that is a value of 0, and the low frequency detection module 124-2 outputs a pulse wave. This result occurs because a frequency of the ballast signal is lower than that of the first and second reference clocks. Namely, the detection signal output module 124-3 receives a low signal, that is, a value of 0, in the set terminal and receives a pulse wave in the reset terminal to output a low signal, that is, a value of 0.

Therefore, the ballast type detecting circuit detects a type of electronic ballast and magnetic ballast based on a digital output signal and decreases a number of outside circuit elements through a ballast type detection approach based on a digital output signal.

The apparatuses, units, modules, devices, and other components illustrated in FIGS. 1-5 that perform the operations described herein with respect to FIGS. 1-5 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-5. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-5 that perform the operations described herein with respect to FIGS. 1-5 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A ballast type detecting circuit comprising:
   a ballast signal clamping circuit coupled to a ballast, wherein the ballast signal clamping circuit is configured to clamp an output of the ballast; and
   a ballast type detection circuit configured to compare first and second reference clocks and the clamped output of the ballast to determine a type of the ballast, each of the first and second reference clocks having a frequency lower than an output frequency of a first type ballast and higher than an output frequency of a second type ballast.

2. The ballast type detecting circuit of claim 1, wherein the ballast signal clamping circuit comprises:
   a high voltage protection circuit configured to protect the ballast signal clamping circuit from an output of the ballast;
   a clamping circuit configured to clamp an output of the ballast at a voltage protection level of a low voltage element; and
   a comparison circuit configured to compare the clamped signal and a reference voltage.

3. The ballast type detecting circuit of claim 2, wherein the clamping circuit applies a DC voltage to an output of the ballast to fix a constant level for a part of a repetition waveform.

4. The ballast type detecting circuit of claim 2, wherein the comparison circuit detects a time at which the clamped signal zero-crosses.

5. The ballast type detecting circuit of claim 2, wherein the high voltage protection circuit is a junction field effect transistor (JFET).

6. The ballast type detecting circuit of claim 1, further comprising:
   a reference clock generator configured to generate the first and second reference clocks.

7. The ballast type detecting circuit of claim 1, wherein the ballast type detection circuit comprises:
   a high frequency detection circuit configured to determine whether a frequency of the ballast signal is higher than that of the first reference clock;
   a low frequency detection circuit configured to determine whether a frequency of the ballast signal is lower than that of the second reference clock; and
   a detection signal output circuit configured to output a ballast type detection signal based on outputs of the high frequency detection circuit and the low frequency detection circuit.

8. The ballast type detecting circuit of claim 7, wherein the high frequency detection circuit counts a number of clock pulses of the ballast signal during periods of the first reference clock.

9. The ballast type detecting circuit of claim 8, wherein the high frequency detection circuit outputs a pulse signal in response to a frequency of the ballast signal being higher than a frequency of the first reference clock.

10. The ballast type detecting circuit of claim 7, wherein the low frequency detection circuit counts a number of clock pulses of the second reference clock during periods of the ballast signal.

11. The ballast type detecting circuit of claim 10, wherein the low frequency detection circuit outputs a pulse signal in response to a frequency of the second reference clock being higher than a frequency of the ballast signal.

12. The ballast type detecting circuit of claim 7, wherein the detection signal output circuit is a latch element.

13. A light emitting diode light apparatus comprising:
   a ballast;
   a ballast type detecting circuit configured to detect an output signal of the ballast to determine the type of the ballast;
   a lighting circuit comprising a light apparatus, the lighting circuit being configured to drive the light apparatus; and
   a controller configured to receive the ballast type detecting signal from the ballast type detecting circuit to control the lighting circuit,
   wherein the ballast type detecting circuit comprises
   a ballast signal clamping circuit coupled to a ballast, wherein the ballast signal clamping circuit is configured to clamp an output of the ballast, and
   a ballast type detection circuit configured to compare first and second reference clocks and the clamped output of the ballast to determine a type of the ballast, each of the first and second reference clocks having a frequency lower than an output frequency of a first type ballast and higher than an output frequency of a second type ballast.

14. The circuit of claim 13, wherein the lighting unit is a flyback converter.

15. The circuit of claim 13, wherein the control unit controls the lighting unit according to a type of the ballast.

16. A ballast type detection circuit, wherein the ballast type detection circuit comprises:
   a high frequency detection circuit configured to determine whether a frequency of a ballast signal is higher than that of a first reference clock;
   a low frequency detection circuit configured to determine whether a frequency of the ballast signal is lower than that of a second reference clock; and
   a detection signal output circuit configured to output a ballast type detecting signal based on outputs of the high frequency detection circuit and the low frequency detection circuit,
   each of the first and second reference clocks having a frequency lower than an output frequency of a first type ballast and higher than an output frequency of a second type ballast.

17. The ballast type detecting circuit of claim 16, wherein the high frequency detection circuit counts a number of clock pulses of the ballast signal during periods of the first reference clock.

18. The ballast type detecting circuit of claim 17, wherein the high frequency detection circuit outputs a pulse signal in response to a frequency of the ballast signal being higher than a frequency of the first reference clock.

19. The ballast type detecting circuit of claim 16, wherein the low frequency detection circuit counts a number of clock pulses of the second reference clock during periods of the ballast signal.

20. The ballast type detecting circuit of claim 19, wherein the low frequency detection circuit outputs a pulse signal in response to a frequency of the second reference clock being higher than a frequency of the ballast signal.

* * * * *